United States Patent
Sakamoto et al.

[11] Patent Number: 6,091,134
[45] Date of Patent: Jul. 18, 2000

[54] SEMICONDUCTOR LEAD FRAME AND METHOD FOR MANUFACTURING THE SAME

[75] Inventors: Tokushi Sakamoto; Chiharu Isobe, both of Yamanashi-ken, Japan

[73] Assignee: Enomoto Co., Ltd., Yamanashi-ken, Japan

[21] Appl. No.: 09/134,274

[22] Filed: Aug. 14, 1998

[30] Foreign Application Priority Data

| Aug. 22, 1997 | [JP] | Japan | 9-241799 |
| Mar. 27, 1998 | [JP] | Japan | 10-100633 |

[51] Int. Cl.$^7$ ............................................. H01L 23/435
[52] U.S. Cl. .................. 257/666; 257/676; 257/696; 257/673; 257/712; 257/713
[58] Field of Search .......................... 257/662, 676, 257/673, 712, 713, 698, 690, 696, 666, 672–674

[56] References Cited

U.S. PATENT DOCUMENTS

| 4,994,895 | 2/1991 | Matsuzaki et al. | 257/674 |
| 5,161,304 | 11/1992 | Queyssac et al. | 257/676 |
| 5,294,876 | 3/1994 | Marcantonio et al. | 257/676 |
| 5,386,142 | 1/1995 | Liang et al. | 257/676 |
| 5,394,751 | 3/1995 | Ishibashi | 257/676 |
| 5,420,758 | 5/1995 | Liang | 257/668 |
| 5,637,915 | 6/1997 | Sato et al. | 257/676 |
| 5,703,398 | 12/1997 | Sono et al. | 257/676 |
| 5,734,198 | 3/1998 | Stave | 257/676 |
| 5,757,070 | 5/1998 | Fritz | 257/676 |
| 5,763,949 | 6/1998 | Woodworth et al. | 257/676 |
| 5,783,860 | 7/1998 | Jeng et al. | 257/676 |

*Primary Examiner*—Tom Thomas
*Attorney, Agent, or Firm*—McAulay Nissen Goldberg & Kiel, LLP

[57] ABSTRACT

A semiconductor device manufacturing method and a semiconductor lead frame and its manufacturing method are disclosed. The semiconductor lead frame, in one form, comprises a chip pad section on which a semiconductor chip is mounted and a lead section including inner leads that are wire-bonded to electrodes of the semiconductor chip and outer leads that protrude out from the lead frame after packaging. Further, when the pad section and the lead section are connected together using a folding portion, which has not been folded, then the chip pad section sits apart from the lead section without overlapping. When the folding portion is folded, the ends of the inner leads of the lead section overlap the chip pad section and are located around a semiconductor chip mounting position of the chip pad section. Other forms of the semiconductor lead frame and various forms of the above-mentioned manufacturing methods are also disclosed.

4 Claims, 10 Drawing Sheets

(A1)

(A2)

(A3)

(A4)

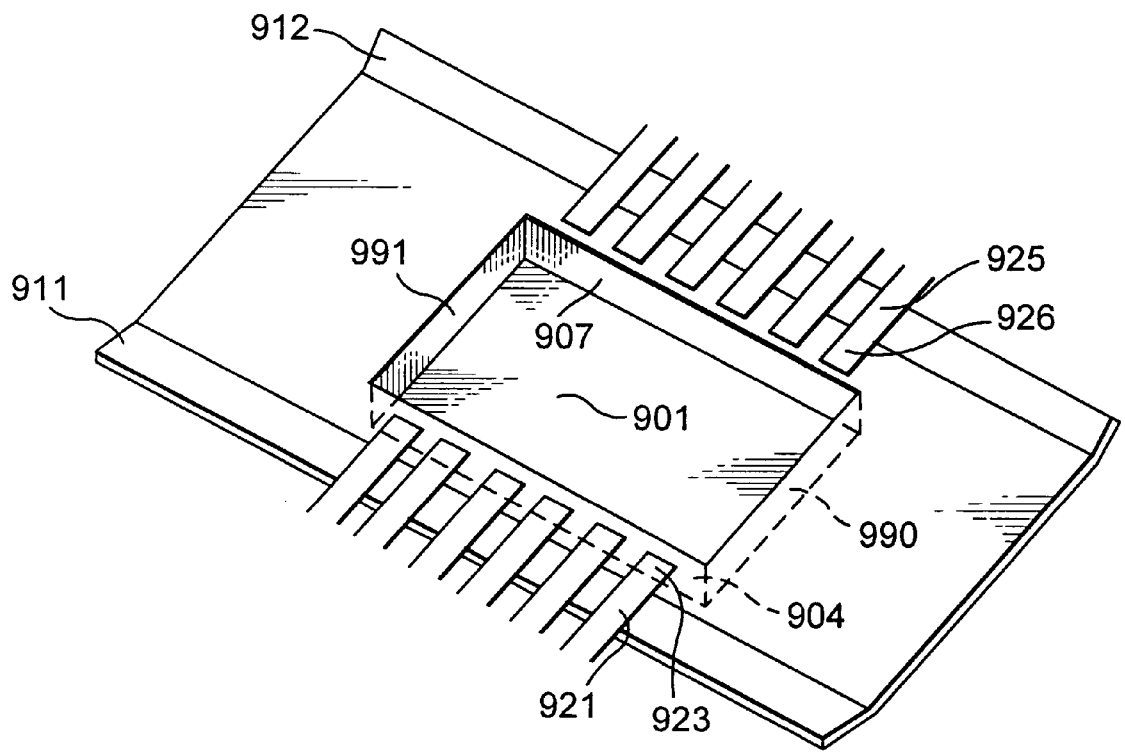
F I G. 11

SEMICONDUCTOR LEAD FRAME AND METHOD FOR MANUFACTURING THE SAME

BACKGROUND OF THE INVENTION a) Field of the Invention

The present invention relates to a method for manufacturing a semiconductor device that is applied to an IC, a power transistor, a thyristor, a diode, an oscillating element, a photodiode, a light emitting diode, a semiconductor laser, a thermistor, or a sensor. In particular, the present is suitable to a method for manufacturing a semiconductor device with high power consumption.

In addition, the present invention relates to a semiconductor lead frame suitable for direct use in implementing the semiconductor manufacturing method, and a method for manufacturing the semiconductor lead frame.

b) Description of the Related Art

In a conventional semiconductor lead frame, the ends of inner leads of a relatively thin lead section are located directly above the periphery of a thick flat rectangular chip pad section, with outer leads extending radially. A semiconductor chip is stuck to the chip pad section, and its thickness is increased to improve heat radiation.

FIG. 8 is a top view of a conventional lead frame, and FIG. 9 is a sectional view taken on line B—B in FIG. 8. A chip pad section 16 and a lead section 27 are conventionally manufactured as separate parts by means of press punching. The chip pad section 16 is a thick rectangular plate, and a semiconductor chip (not shown) is mounted on a top surface 161 at a semiconductor mounting position 162 by means of sticking. Cylindrical assembly pins 163, 164, 165, and 166 integrally stand from the four corners of the top surface 161 of the chip pad section 16.

Two lead sections 27 and 28 are manufactured as separate parts by means of press punching. Tie bars 273 and 283 are located between inner leads 271 and 281, the tips of which are located at the semiconductor mounting position 162 and outer leads 274 and 284 protruding out after packaging, in order to restrain the inter-lead positions from varying while preventing resin from protruding during resin packaging. In addition, the tips of the outer leads 274 and 284 are respectively coupled together by outer bars 275 and 285 to restrain the inter-lead positions from varying. Assembly pieces 81, 82, 83, and 84 are integrally formed at the lateral ends of the lead sections 27 and 28 and protrude toward the tips of the inner leads. Assembly holes 811, 821, 831, and 841 are drilled near the tips of the assembly pieces 81, 82, 83, and 84, respectively.

As shown in FIG. 9, after an assembly pin 166 of the chip pad section 16 has been inserted into the assembly hole 841 in the assembly piece 84 of the lead section 28, the tip of the assembly pin 166 is compressed and crushed to form a large-diameter portion 167, which is used to fix the assembly piece 84. If a top surface 842 of the assembly piece 84 is used as a curved surface for press punching while a bottom surface 843 is used for a burr surface for press punching, the neighborhood of the tips of the inner leads 281 is flattened and compressed to increase the area of the plane portion in order to reduce inappropriate wire-bonded connections. 'A burr surface' means a surface side having a burr. If a sheet material with one surface Au- or Ag-plated is used, the lead frame is assembled in such a way that the plated layer lies in the top surface.

Furthermore, a conventional semiconductor device manufacturing method obtains a semiconductor device by sticking and fixing a semiconductor chip on the chip pad section of the conventional semiconductor lead frame, carrying out wire bonding to connect each electrode on the semiconductor chip to the end of each inner lead of the semiconductor lead frame using a gold wire, and then executing resin molding to seal the lead frame with a hot-melted resin except for the outer lead section.

Strict dimensional and locational accuracy, however, is required for the assembly pins formed on the chip pad section and the assembly holes formed in the lead section. These components are difficult to design, manufacture, and manage, and have a relatively low yield.

In addition, the assembly of the chip pad and lead sections is automated, but errors are likely to occur during the supply, alignment, and caulking of small parts.

As a result, a trade-off is required between the accuracy and yield of assembled lead frames, and it is difficult to meet both of them.

OBJECT AND SUMMARY OF THE INVENTION

It is a primary object of the present invention to provide a semiconductor device manufacturing method and a semiconductor lead frame and its manufacturing method which provide high accuracy and which require relatively low costs.

SUMMARY OF THE INVENTION

The object of the present invention described above can be accomplished by a semiconductor lead frame in accordance with a first form of the invention wherein the semiconductor lead frame comprises a chip pad section on which a semiconductor chip is mounted; and a lead section including inner leads that are wire-bonded to electrodes of the semiconductor chip and outer leads that protrude out from the lead frame after packaging, wherein:

when the pad section and the lead section are connected together using a folding portion, which has not been folded, then the chip pad section sits apart from the lead section without overlapping, whereas when the folding portion is folded, the ends of the inner leads of the lead section overlap the chip pad section and are located around a semiconductor chip mounting position of the chip pad section.

The object of the present invention described above can be also accomplished by a semiconductor lead frame in accordance with a second form of the invention wherein the semiconductor lead frame comprises a chip pad section on which a semiconductor chip is mounted; and a lead section including inner leads that are wire-bonded to electrodes of the semiconductor chip and outer leads that protrude out from the lead frame after packaging, wherein:

when the pad section and the lead section are connected together using a rotating portion, around which the lead section has not been rotated, then the chip pad section sits apart from the lead section without overlapping, whereas when the lead section is rotated through 180° around the rotating portion, the ends of the inner leads of the lead section overlap the chip pad section and are located around a semiconductor chip mounting position of the chip pad section.

Further, the object of the present invention described above can be also accomplished by a semiconductor device manufacturing method in accordance with a third form of the invention wherein the semiconductor device manufacturing method comprises the steps of press-punching a lead-frame alloy plate to form a chip pad preparation section and a lead section; press-rectangular-drawing the chip pad preparation section to form a chip pad section shaped like a square cup having a bottom surface, sides, and an open top; executing down setting so that the ends of inner leads of the lead section are located slightly above the periphery of the chip pad section; sticking a semiconductor chip to an inner bottom surface of the chip pad section; executing wire bonding to connect each electrode of the semiconductor chip to the end of each inner lead using a wire; and then executing resin molding to expose an outer bottom surface of the chip pad section.

Furthermore, the object of the present invention described above can be also accomplished in a fourth form of the invention wherein the semiconductor device manufacturing method comprises the steps of press-punching a lead-frame alloy plate to form a chip pad preparation section, a lead section, and a folding portion that connects the chip pad preparation section and lead sections together; press-rectangular-drawing the chip pad preparation section to form a chip pad section shaped like square cup having a bottom surface, sides, and an open top; folding the folding portion by means of pressing to allow the ends of inner leads of the lead section to overlap the chip pad section in order to locate the ends around a semiconductor chip mounting position of the chip pad section; executing down setting so that the lead section is located slightly above the chip pad section; sticking a semiconductor chip to an inner bottom surface of the chip pad section; executing wire bonding to connect each electrode of the semiconductor chip to the end of each inner lead using a wire; and then executing resin molding to expose an outer bottom surface of the chip pad section.

Furthermore, the object of the present invention described above can be also accomplished by a semiconductor device manufacturing method in accordance with a fifth form of the invention wherein the semiconductor device manufacturing method comprises the steps of press-punching a lead-frame alloy plate to form a chip pad preparation section, a lead section, and a rotating portion that connects the chip pad preparation section and lead sections together; press-rectangular-drawing the chip pad preparation section to form a chip pad section shaped like a square cup having a bottom surface, sides, and an open top; repeating press bending to rotate the lead section through 180° around the rotating portion in order to allow the ends of inner leads of the lead section to overlap the chip pad section, thereby locating the ends around a semiconductor chip mounting position of the chip pad section, executing down setting so that the lead section is located slightly above the chip pad section; sticking a semiconductor chip to an inner bottom surface of the chip pad section; executing wire bonding to connect each electrode of the semiconductor chip to the end of each inner lead using a wire; and then executing resin molding to expose an outer bottom surface of the chip pad section.

Furthermore, the object of the present invention described above can be also accomplished by a semiconductor lead frame in a sixth form of the invention wherein the semiconductor lead frame is a semiconductor lead frame comprising a lead section and a chip pad section wherein the chip pad section is shaped like a square cup with an open top and wherein the ends of inner leads of the lead section are located slightly above the periphery of the chip pad section.

BRIEF DESCRIPTION OF THE INVENTION

In the drawings:

FIG. 11 is a perspective view of the semiconductor device shown in FIG. 10.

DESCRIPTION OF THE PREFERRED EMBODIMENTS

Several embodiments of a semiconductor device, a semiconductor lead frame, and their manufacturing methods according to the present invention are described below in detail with reference to the accompanying drawings.

Embodiment 1

Figure 1:
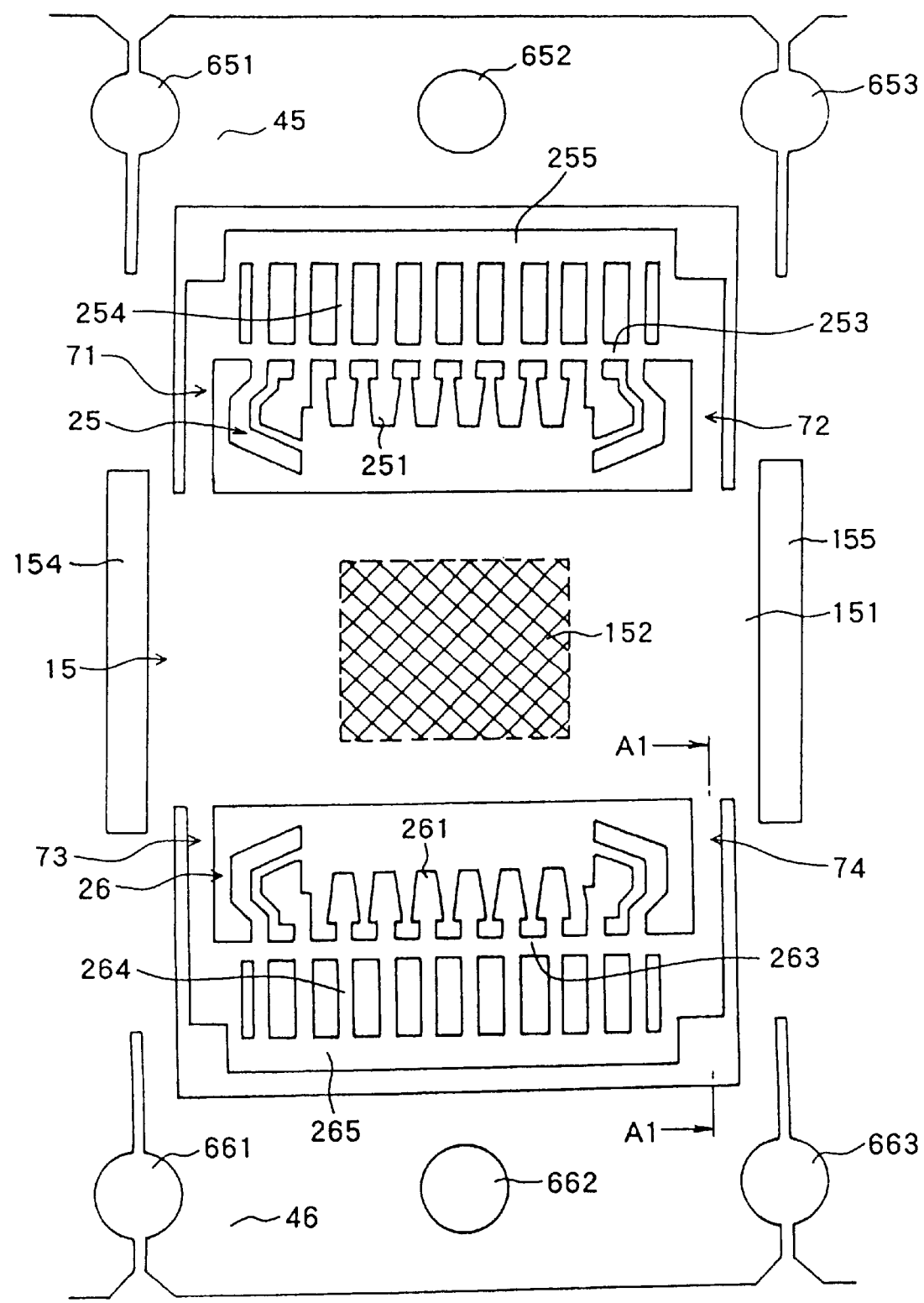
FIG. 1 is a top view showing a lead frame according to Embodiment 1 of the present invention for which only press punching has been executed.

FIG. 1 is a top view showing a lead frame according to the present invention for which only press punching has been executed. A long lead-frame alloy coil sheet material having a thick portion at its center and thin portions on its respective width-wise sides is subjected to multiplaten press punching using a transfer press to obtain an intermediate product 1 of a lead frame according to Embodiment 1. In FIG. 1, the vertical direction is the width direction of the long coil sheet material, while the lateral direction is the longitudinal direction of the long coil sheet material. This figure shows a surface of the long coil sheet material which is flat and which has no stages. A rear surface has stages. A chip pad section 15 is formed in the central thick portion, and lead sections 25 and 26 are formed in the upper and lower thin portions, respectively. Folding portions 71 and 72 connect the chip pad section to the lead section 25, and folding portions 73 and 74 similarly connect the chip pad section to the other lead section 26.

The folding portions 71, 72, 73, and 74 are all formed in the thin portions of the long coil sheet material and shaped like rectangles extending in the width direction of the long coil sheet material.

The chip pad section 15 is formed in the thick portion of the long coil sheet material to improve the heat radiating capability. A semiconductor chip mounting position 152 (the shaded portion in FIG. 1) at which a semiconductor chip (not shown) is mounted is provided at the center of a surface 151 of the chip pad section 15. Rectangular punched portions 154 and 155 are formed on the right and left of the chip pad section 15 for cutting and separation.

The lead section 25 is formed in the thin portion in the upper part of the long coil sheet material. Inner leads 251 extend inward and those inner leads which are located close to the right and left ends are bent leftward and rightward, respectively. Outer leads 254 extend outward from a tie bar 253 located between the inner and outer leads. The outer ends of the outer leads 254 are connected together by an outer bar 255 so as not to move uncontrolledly.

The lead section 26 is similar to the lead section 25.

Guide holes 651, 652, and 653; and 661, 662, and 663 are provided in frame sections 45 and 46, respectively, located near the respective width-wise ends of the long coil sheet material to enable multiplaten or tandem press die sets to be precisely aligned and to enable the long coil sheet material to be automatically fed. In addition, sensor holes (not shown) are provided near the width-wise ends of the long coil sheet material to enable the position of the long coil sheet material to be precisely detected.

Figure 2:
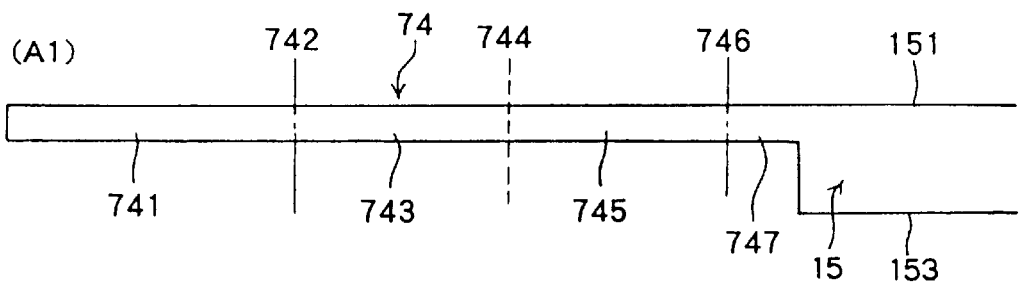
FIG. 2 is a sectional view showing the bending of the lead frame according to Embodiment 1 of the invention.
Figure 2:
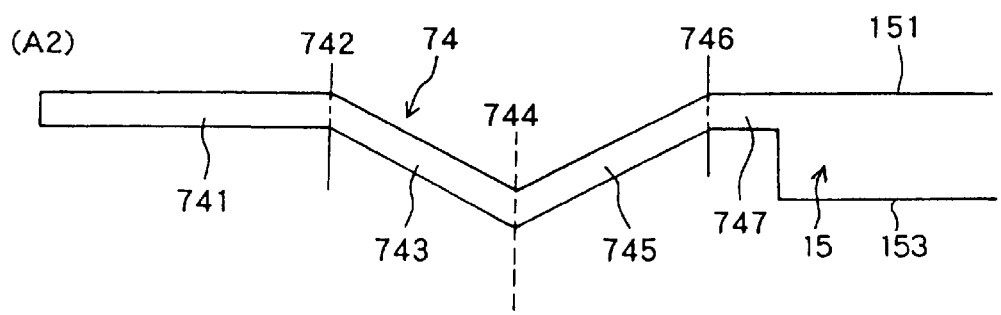
Figure 2:
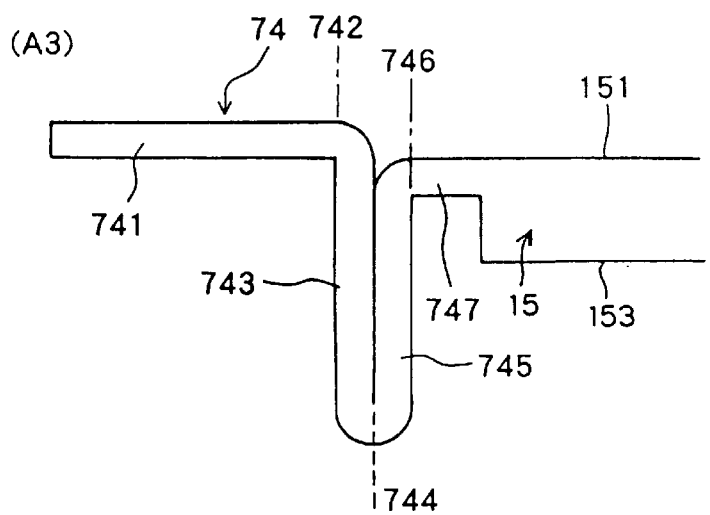
Figure 2:
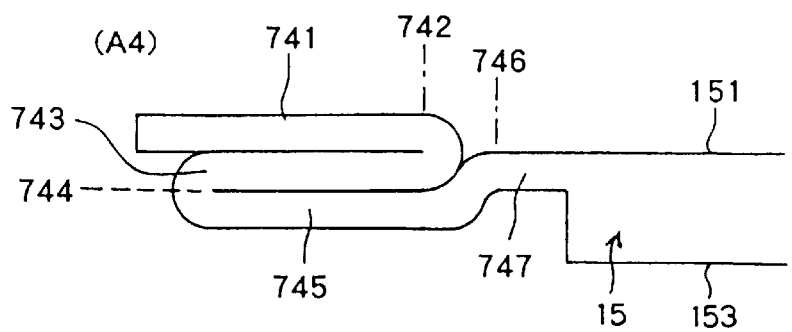

FIG. 2 is a sectional view showing the bending of the lead frame according to Embodiment 1 of the present invention. FIG. 2(A4) is a sectional view taken along line A1—A1 in FIG. 1 showing a lead frame intermediate product for which only press punching has been executed. There is no stage on the surface 151 of the chip pad section 15 and on the surface of the folding portion 74, and both surfaces sit on a single straight line. A rear surface 153 of the chip pad section 15 is not flush with a rear surface of the folding portion 74. The folding portion 74 consists of a chip pad section connection 747 adjacent to the chip pad section 15; a first bent portion 745; a second bent portion 743; a lead section connection 741 adjacent to the lead section (not shown) which are located in this order. A first downward-folding line 746 is provided on the boundary between the chip pad section connection 747 and the first bent portion 745, an upward-folding line 744 is provided on the boundary between the first bent portion 745 and the second bent portion 743, and a second downward-folding line 742 is provided on the boundary between the second bent portion 743 and the lead section connection 741. A multiplaten or tandem press machine is used to sequentially fold the folding portion by folding the folding portion downward relative to the surface (viewing the upper part of FIG. 2 from above) at the first and second downward-folding lines 746 and 742 as shown in (A2), while folding the folding portion upward relative to the surface at the upward folding line 744. Subsequently, the folding portion is bent to adhere the first and second bent portions 745 and 743 together as shown in (A3) so that they extend in the perpendicular direction. As shown in (A4), the folding portion is further bent clockwise in FIG. 2 so as to lie in a horizontal surface while the first and second bent portions 745 and 743 are adhered together, thereby adhering the second bent portion 743 to the lead section connection 741.

Once the bending has been finished, the lead section (not shown), which remains in the horizontal surface, moves toward the chip pad section 15.

Figure 3:
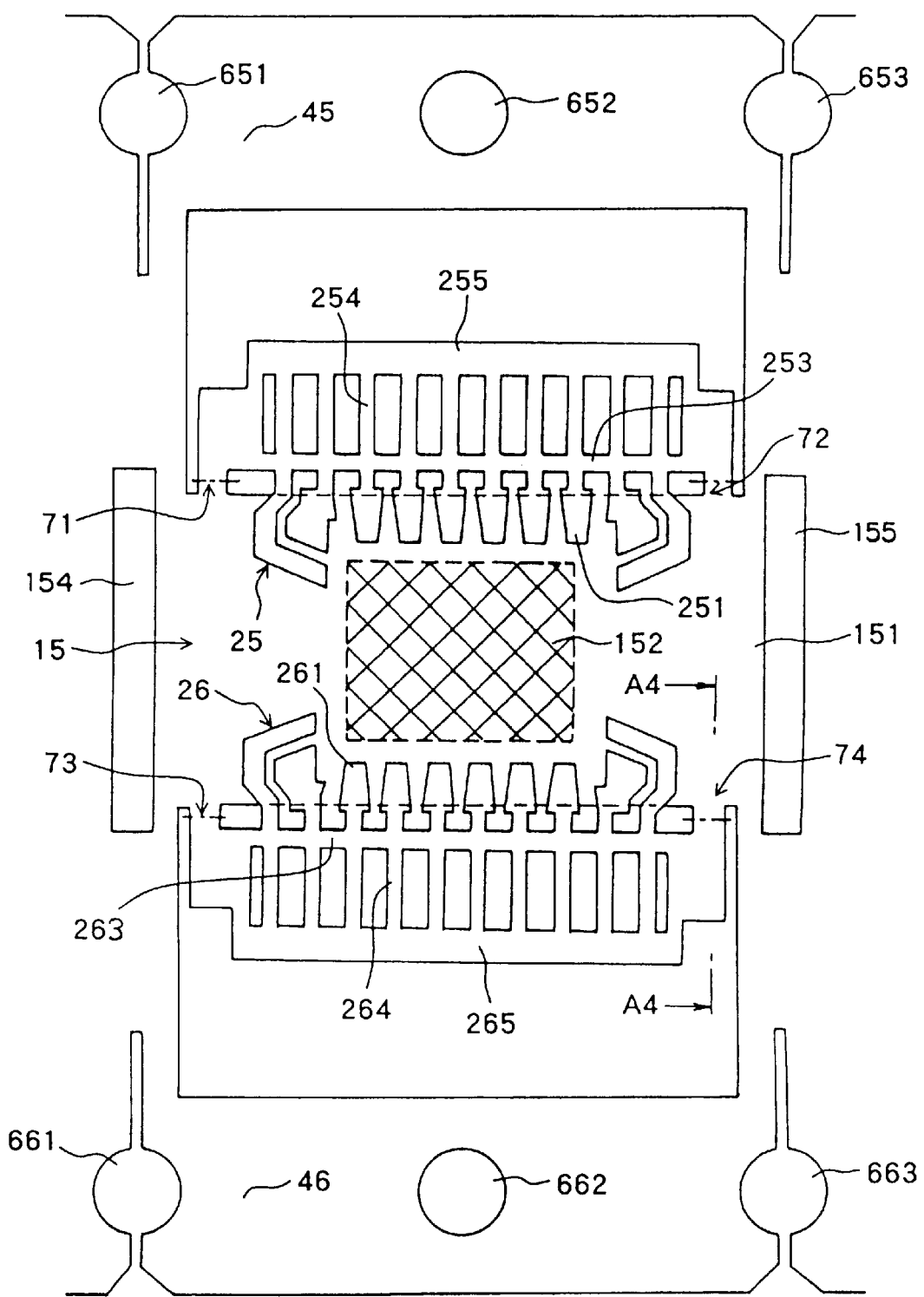
FIG. 3 is a top view showing the lead frame according to Embodiment 1 of the present invention which has been completed through bending.

FIG. 3 is a top view of the lead frame according to Embodiment 1 of the present invention which has been completed through bending. Although the chip pad section 15 and the frame sections 45 and 46 have not moved, the bending has caused the lead sections 25 and 26 to move inward, and the tips of the inner leads 251 and 261 have overlapped the chip pad section 15 so as to be located around the semiconductor chip mounting position 152. FIG. 2(A2) shows a cross section taken along line A4—A4 in FIG. 3.

Embodiment 1 integrally press-punches the chip pad and lead sections and then carries out bending to allow the lead sections to overlap the chip pad section, so the continuous manufacturing of lead frames can be continuously automated relatively easily and errors are unlikely to occur to enable very accurate lead frames to be stably manufactured. Furthermore, this embodiment can reduce the number of required die sets of multiplaten or tandem press die sets and thus the number of press machines, thereby enabling relatively inexpensive lead frames to be manufactured.

In FIG. 3, the dotted lines located slightly inward from the tie bars 253 and 263 and extending in the longitudinal direction indicate the end sides of the chip pad section 15.

In the lead frame according to Embodiment 1, a semiconductor chip is mounted on the chip pad section 15 at the semiconductor chip mounting position 152 by means of sticking, and a large number of electrodes of the semiconductor chip are wire-bonded to the neighborhood of the tips of the corresponding inner leads using Au wires. Compared to conventional lead frames, Embodiment 1 can reduce the distance between the electrode of the semiconductor chip and the neighborhood of the tip of the corresponding inner lead to reduce the amount of Au wires used, thereby contributing to the reduction of the costs of semiconductor devices.

Subsequently, the vertical gap between the tie bars 253 and 263 and the lateral gap between the rectangular punched portions 154 and 155 are resin-molded using an injection molding machine. In this case, the resin molding is provided while the outer bars 255 and 256 are being slightly pressed downward so as not to contact the chip pad section 15 with the lead sections 25 and 26, thereby causing the chip pad section to leave the lead sections to allow the resin to enter between the sections for insulation. Subsequently, the lead frame is cut along the chain lines shown in the figure to cut and remove the tie bar section between the leads in order to obtain a semiconductor element.

Embodiment 2

Figure 4:
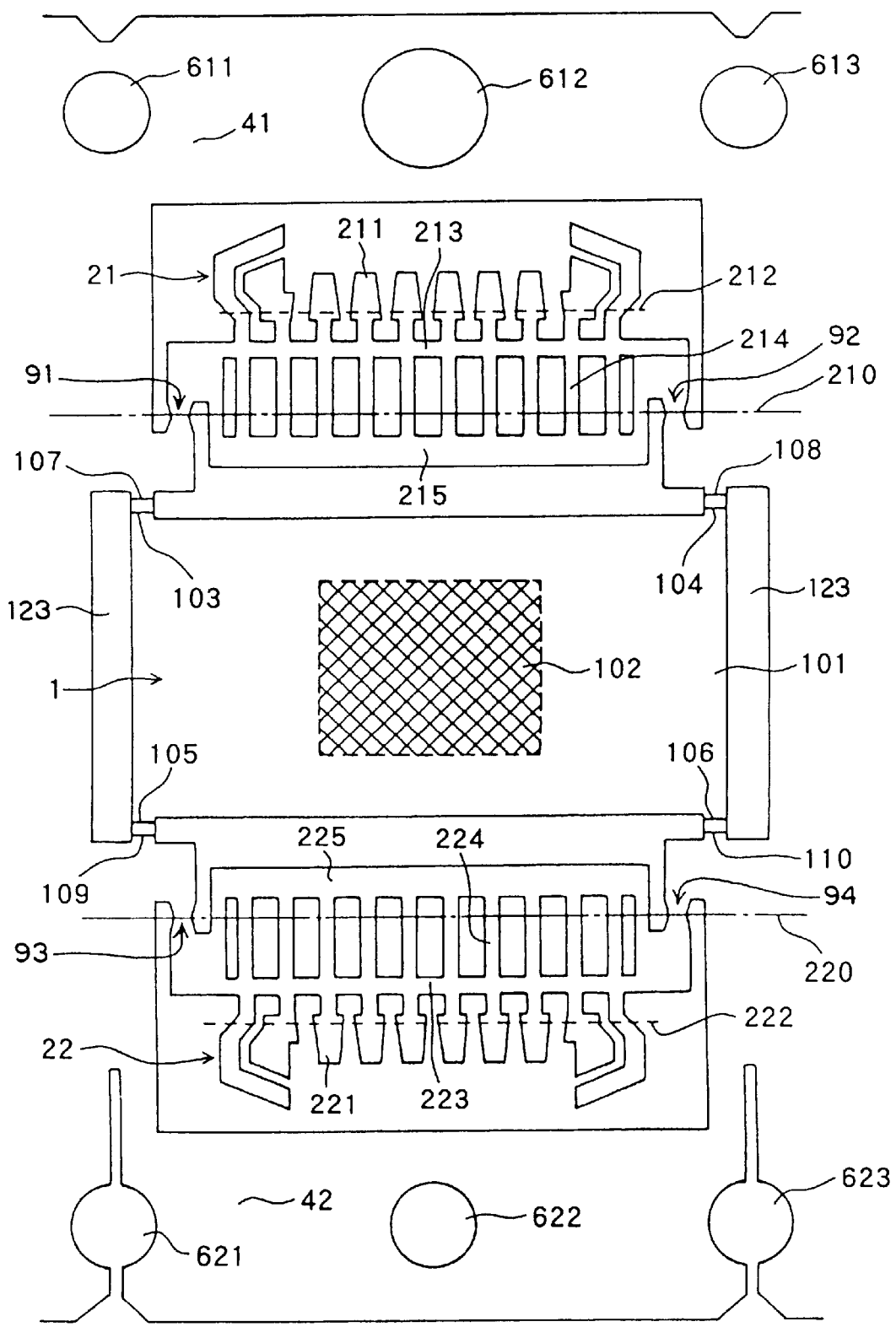
FIG. 4 is a top view showing a lead frame according to Embodiment 2 of the present invention for which only press punching has been executed.

FIG. 4 is a top view showing a lead frame according to Embodiment 2 of the present invention for which only press punching has been executed. A long lead-frame alloy coil sheet material having a thick portion at its center and thin portions on its respective width-wise sides is subjected to multiplaten or tandem press punching to obtain an intermediate product of a lead frame according to Embodiment 2. In FIG. 2, the vertical direction is the width direction of the long coil sheet material, while the lateral direction is the longitudinal direction of the long coil sheet material. This figure shows a surface of the long coil sheet material which is flat and which has no stages. A rear surface has stages. A chip pad section 1 is formed in the central thick portion, and lead sections 21 and 22 are formed in the upper and lower thin portions, respectively. Rotating portions 91 and 92 connect the chip pad section 1 to the lead section 21, and rotating portions 93 and 94 similarly connect the chip pad section 1 to the other lead section 22.

The chip pad section 1 is formed in the thick portion of the long coil sheet material to improve the heat radiating capability. A semiconductor chip mounting position 102 (the shaded portion in FIG. 4) at which a semiconductor chip (not shown) is mounted is provided at the center of a surface 101 of the chip pad section 1. Rectangular punched portions 123 and 124 are formed on the right and left of the chip pad section 1 for cutting and separation.

The lead section 21 is formed in the thin portion in the upper part of the long coil sheet material. In contrast to Embodiment 1, inner leads 211 extend outward and those inner leads which are located close to the right and left ends are bent leftward and rightward, respectively. Outer leads 214 extend inward from a tie bar 213 located between the inner and outer leads. The outer ends of the outer leads 214 are connected together by an outer bar 215 so as not to move uncontrolledly.

The lead section 22 is similar to the lead section 21.

The rotating portions 91, 92, 93, and 94 are all formed in the thin portions of the long coil sheet material.

Guide holes 611, 612, and 613; and 621, 622, and 623 are provided in frame sections 41 and 42, respectively, located near the respective width-wise ends of the long coil sheet material to enable multiplaten or tandem press die sets to be precisely aligned and to enable the long coil sheet material to be automatically fed. In addition, sensor holes (not shown) are provided near the width-wise ends of the long coil sheet material to enable the position of the long coil sheet material to be precisely detected.

Figure 5:
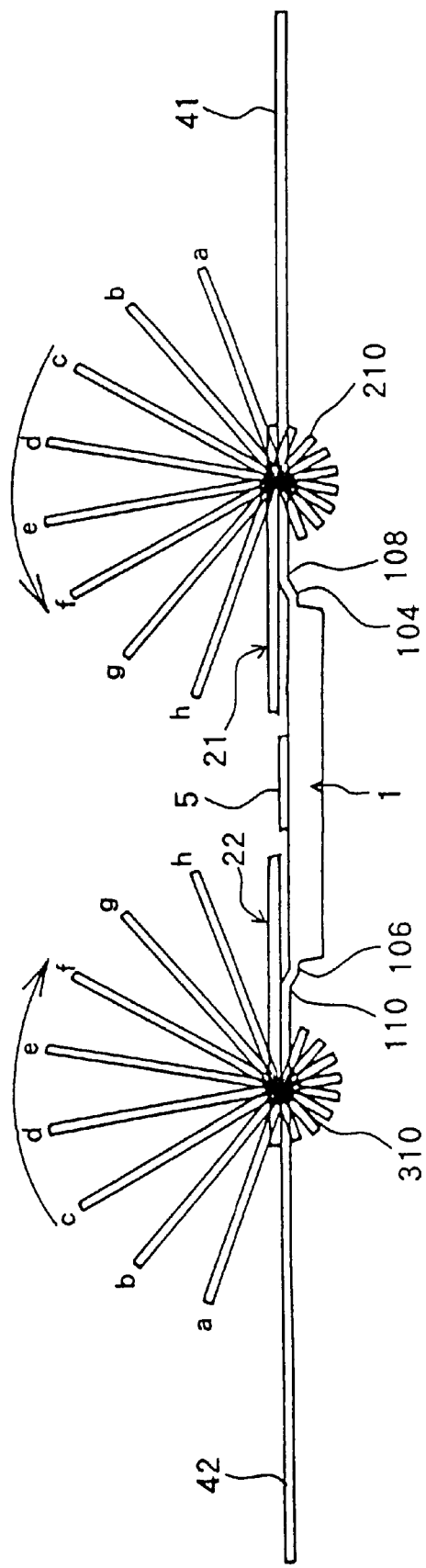
FIG. 5 is a sectional view showing the rotary forming of the lead frame according to Embodiment 2 of the present invention.

FIG. 5 is a sectional view showing the rotary forming of the lead frame according to Embodiment 2 of the present invention. The lead section 21 rotates around a rotating axis 210 passing through the rotating portions 91 and 92 in FIG. 4, and the lead section 22 rotates around a rotating axis 220 passing through the rotating portions 93 and 94. It should be noted that the rotating axes 210 and 220 are not located at the center of the lead sections 21 and 22, respectively, but close to the outer leads 214 and 224, respectively.

In FIG. 5, prior to rotary forming, the chip pad section 1 is bent along folding lines 106, 110, 104, 108, 105, 109, 103, and 107 and is lowered a distance corresponding to the thickness of a semiconductor chip 5. The semiconductor chip 5 is stuck and mounted on the chip pad section 1 at the semiconductor chip mounting section 102 using an adhesive having a good heat conductivity.

The lead section 21 is sequentially rotated counterclockwise around the rotating axis 210 to move the tips of the inner leads to above the chip pad section 1. Likewise, the lead section 22 is sequentially rotated clockwise around the rotating axis 310. A multiplaten or tandem press is used to provide rotations in the order of (a), (b), (c), (d), (e), (f), (g), and (h).

Figure 6:
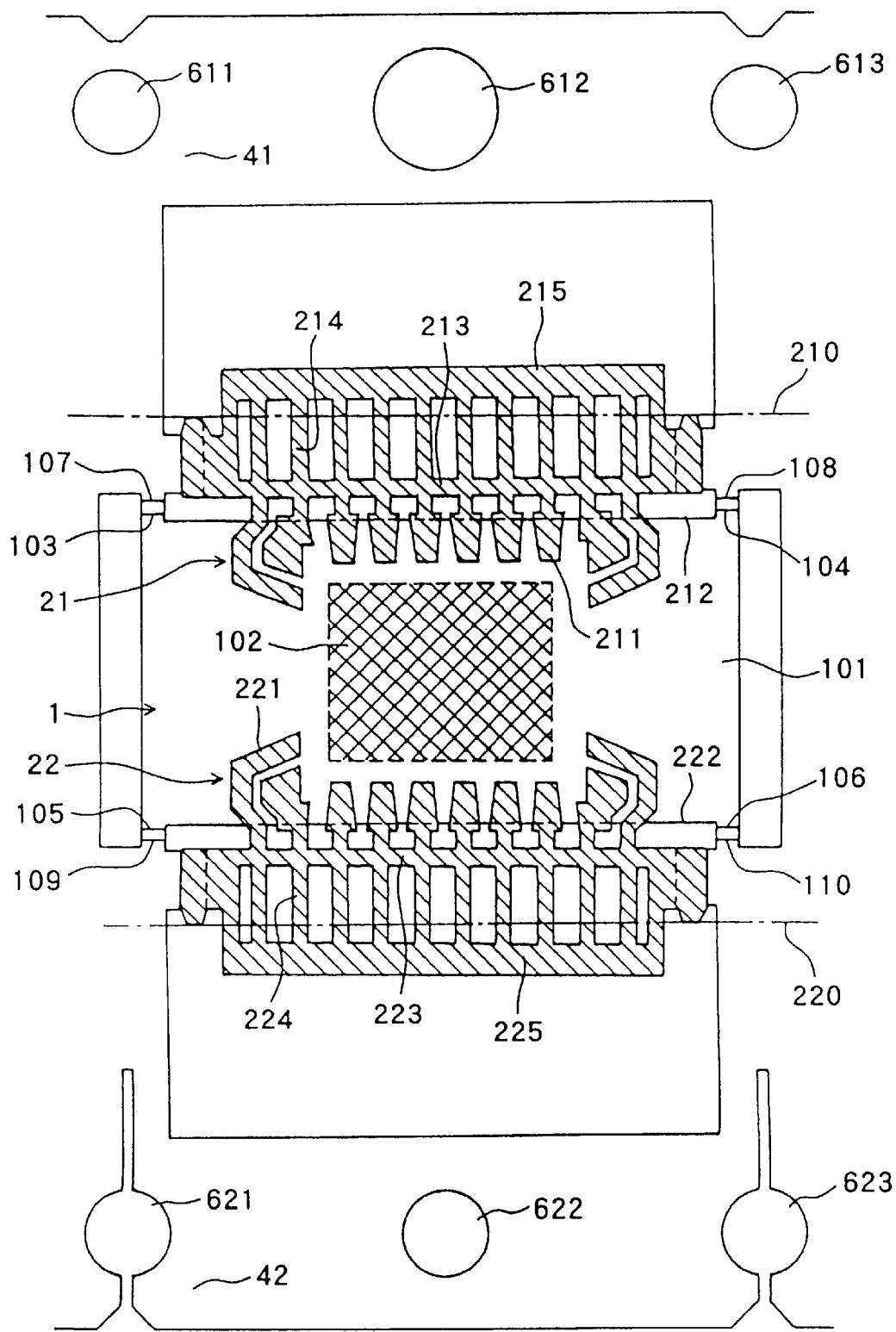
FIG. 6 is a top view showing the lead frame according to Embodiment 2 of the present invention which has been completed through rotary forming.

FIG. 6 is a top view of the lead frame according to Embodiment 2 of the present invention which has been completed through rotary forming. Although the chip pad section 1 and the frame sections 41 and 42 have not moved, the rotary forming has caused the lead sections 21 and 22 to rotate 180° around the rotating axes 210 and 220, respectively, and the tips of the inner leads 211 and 221 have overlapped the chip pad section 1 so as to be located around the semiconductor chip mounting position 102.

Embodiment 2 integrally press-punches the chip pad and lead sections and then rotates the lead sections through 180° to allow them to overlap the chip pad section, so the continuous manufacturing of lead frames can be automated continuously relatively easily and errors are unlikely to occur to enable very accurate lead frames to be stably manufactured. Furthermore, this embodiment can reduce the number of required die sets of multiplaten or tandem press die sets and thus the number of press machines, thereby enabling relatively inexpensive lead frames to be manufactured. Furthermore, only the lead sections are rotated through 180° and turned upside down, so a burr surface (a rear surface) of the lead section is located on the top surface of the completed lead frame to increase the plane portion for the tips of the inner leads to eliminate the needs for flattening required to prevent inappropriate wire bonding, while a bent surface (a front surface) is located on the top surface of the chip pad section, thereby providing a quality lead frame.
Embodiment 3

In the lead section, the inner leads are located outside while the outer leads are located inside, as in Embodiment 2, and they are connected to the chip pad section at the center of the lead section using a rotary folding portion. According to Embodiment 3, after press punching as described above, the lead section is rotated through 180° around the rotating axis passing through the rotary folding portion to direct the inner leads inward while directing the outer leads outward. Then, as in Embodiment 1, the rotary folding portion is folded and only the lead section is moved toward the chip pad section.

Embodiment 3 increases the number of process steps but provides the advantages of both Embodiments 1 and 2.
Embodiment 4

Figure 7:
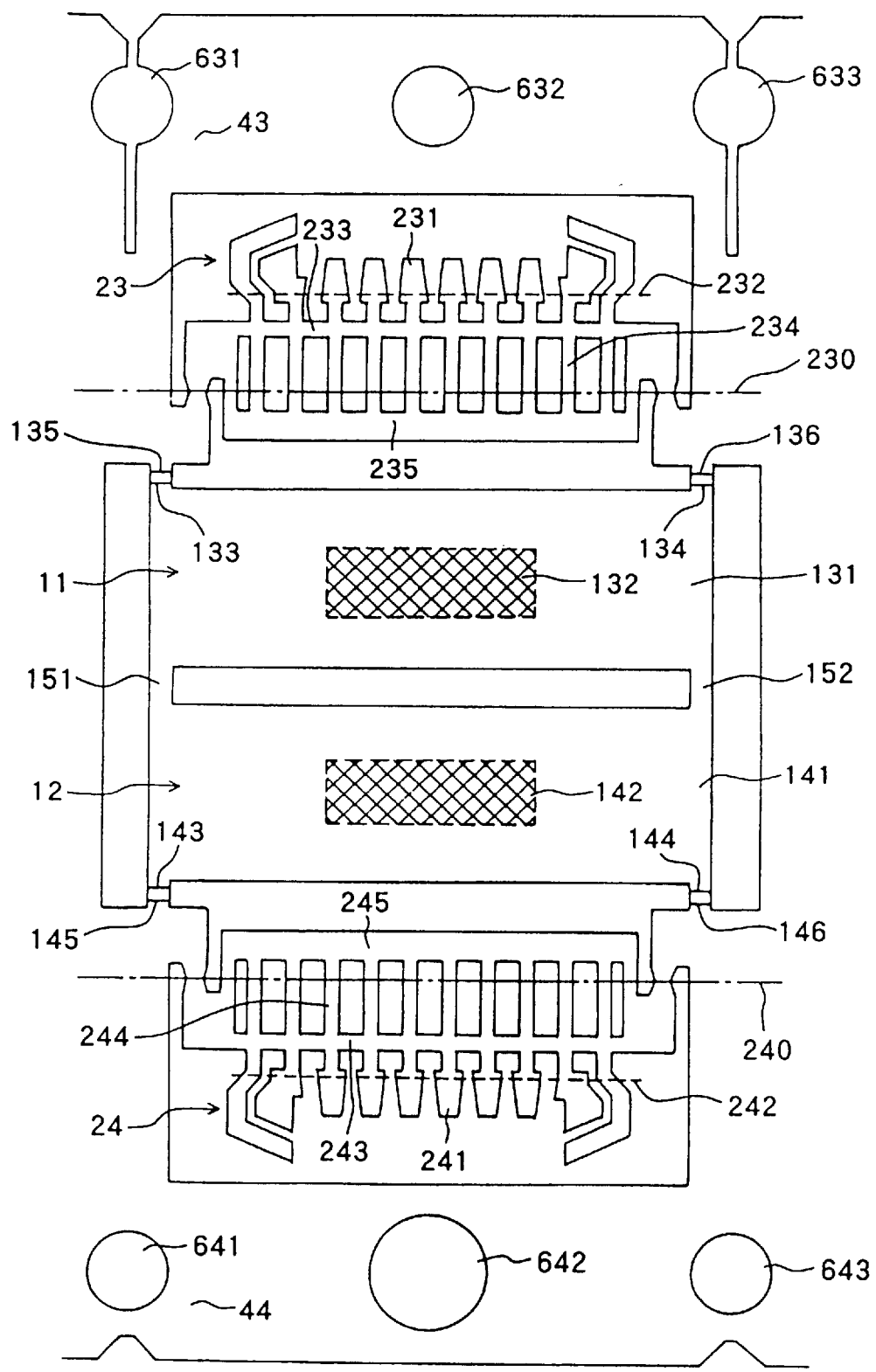
FIG. 7 is a top view showing a lead frame according to Embodiment 4 of the present invention for which only press punching has been executed.
Figure 8:
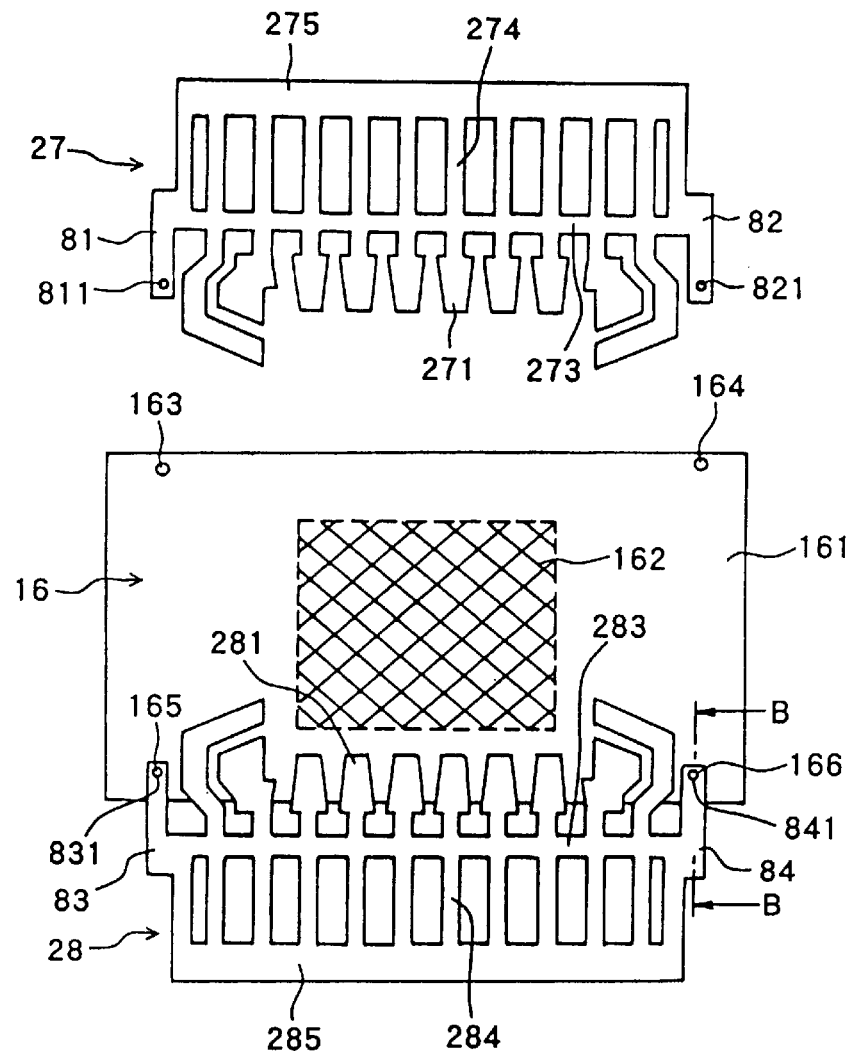
FIG. 8 is a top view of a conventional lead frame.
Figure 9:
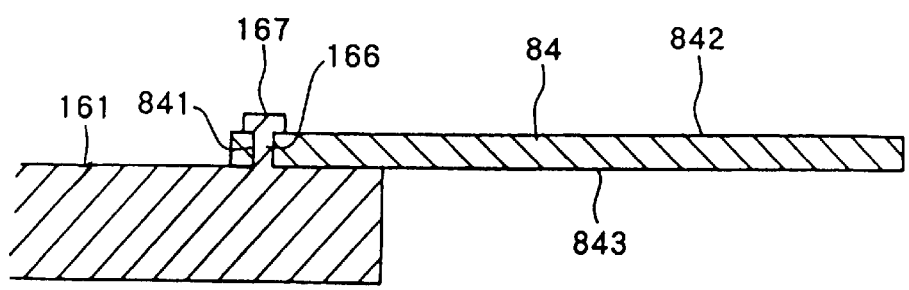
FIG. 9 is a sectional view taken on line B—B in FIG. 8.

FIG. 7 is a top view of a lead frame according to Embodiment 4 of the present invention for which only press punching has been executed.

According to Embodiment 4, lead sections 23 and 24 are located on only one side of chip pad sections 11 and 12, respectively, and these components are disposed adjacent to each other in two rows. After press punching, only the lead sections 23 and 24 are rotated through 180° to move the tips of the inner leads 231 and 241 to above the chip pad sections, as in Embodiment 2.

According to the lead frame of the present invention, dimensionally accurate quality lead frames can be manufactured and manufacturing costs can be relatively reduced.

The lead frame according to the present invention can locate the tips of the inner leads closer to the semiconductor chip to reduce the amount of Au wires used for wire bonding and thus costs.

Second, according to the lead frame of the present invention, a long coil sheet material with its rear surface stripe-plated is subjected to press punching. Thus, the plated surface is unlikely to be degraded by residue or oil from the press-punching step, so quality lead frames can be obtained. In addition, the lead sections constitute a burr surface to provide a wide flat surface without flattening, thereby preventing inappropriate wire bonding.

According to the semiconductor lead frame manufacturing method of the present invention, a long deformed coil sheet material of a specified cross section having a thick portion and a thin portion located adjacent to each other in the width direction is press-punched to form the chip pad and lead sections and folding (or rotating) portion. The chip pad section is formed in the thick portion of the deformed coil sheet material, the lead section is formed in the thin portion, and the folding (rotating) portion is formed to connect the chip pad and lead sections together. Subsequently, the folding portion is folded by means of press bending (or the lead section is rotated around the rotating portion by repeating press bending) to locate the ends of the inner leads of the lead section slightly above the periphery of the chip pad section.

Thus, according to the above semiconductor lead frame of the present invention, the deformed coil sheet material is expensive and bulky, and only a small length of coil sheet material can be wound around a single reel to prevent long continuous operations, thereby requiring the operation to be frequently stopped to replace reels. Consequently, the operability is low.

Thus, the applicant improved the above semiconductor lead frame according to the present invention to invent a semiconductor device and a semiconductor lead frame.

Next, embodiments of the semiconductor device and lead frame according to the present invention are described in detail.

A lead-frame alloy sheet material of a specified thickness is press-punched to form (1) a rectangular chip pad preparation section, (2) a lead section including inner leads, a tie bar, and outer leads, and (3) a rotating portion that connects the chip pad preparation section to the lead section. This press punching preferably uses a transfer press method of placing a plurality of press-punching die sets in parallel and passing a long sheet material through the die sets for sequential press punching. This method enables a large amount of relatively inexpensive lead frames of accurate dimensions to be manufactured. The lead-frame alloy sheet material normally has a thickness of 0.25 to 0.65 mm and consists of a copper alloy such as oxygen-free copper or zirconium copper, or an iron alloy such as stainless steel or 42 alloy.

Next, the chip pad preparation section is subjected to press-rectangular-drawing to form a chip pad section shaped like a rectangular cup having a bottom surface, sides, and an open top surface. The bottom surface is rectangular, and the sides extend from the respective sides of the bottom surface in such a way that they are slightly tilted relative to the perpendicular direction and that the distance between the opposite sides increases as they approach the top. The bottom surface and the sides are closely connected together, and the adjacent sides are also closely connected together. The height of the side is normally 0.5 to 2 mm.

Subsequently, press bending is repeated to rotate the lead section through 180° in total around the rotating portion in order to allow the ends of the inner leads of the lead section to overlap the open side of the chip pad section. Thus, the ends are located around a semiconductor chip mounting position in the chip pad section. Preferably, the transfer press method is also used to rotationally form the lead section through repeated press bending so that a partially fabricated lead frame is passed through die sets for sequential rotary forming.

Subsequently, the rotating portion that connects the lead section to the chip pad section is press-bent so that the inner leads of the lead section are located apart from and slightly above the chip pad section. This processing is called down setting. The amount of down setting is such that the lead and chip pad sections are not short-circuited, but preferably is minimized to reduce the distance between the ends of the inner leads and electrodes of the semiconductor chip and thus the length of lead wires used. A semiconductor lead frame is manufactured through the above series of operations.

A method for manufacturing a semiconductor device using this semiconductor lead frame is described below.

A semiconductor chip is stuck to a specified position at the center of the inner bottom surface of a chip pad section shaped like a square cup with an open top.

Then, lead wires such as gold wires are used to connect the electrodes of the semiconductor chip to the ends of the inner leads of the lead section. This processing is generally called wire bonding.

Figure 10:
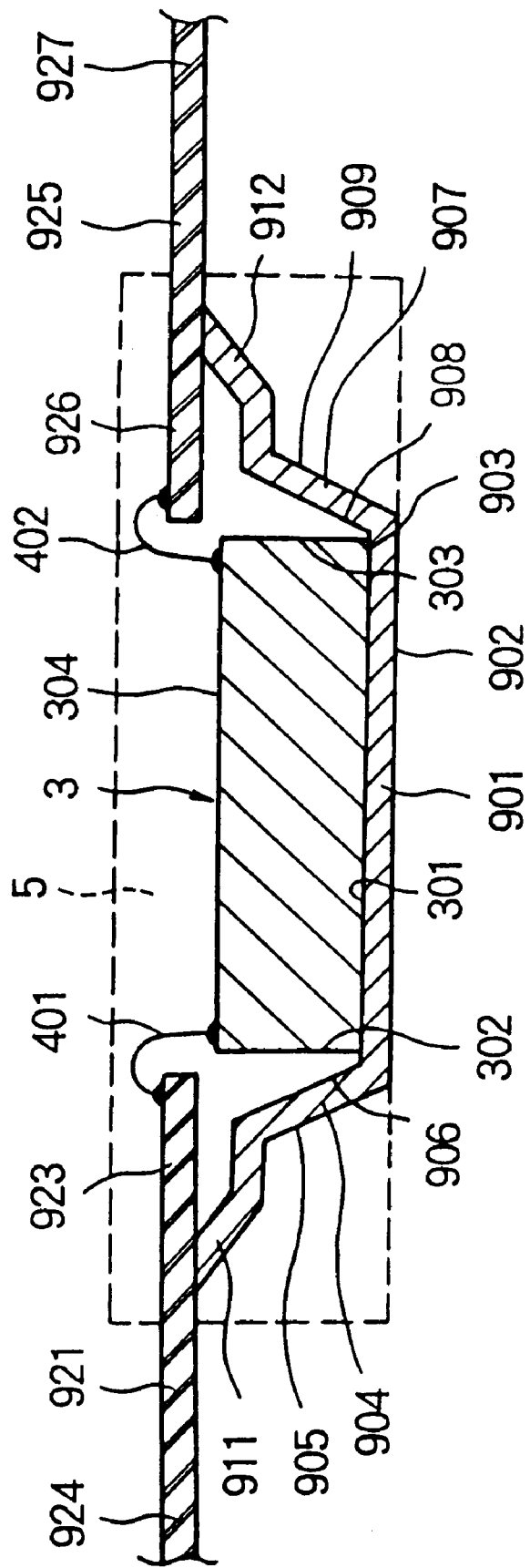
FIG. 10 is a sectional view showing a semiconductor device according to Embodiment 5 of the present invention which has been wire-bonded.

FIG. 10 is a sectional view and FIG. 11 is a perspective view of a semiconductor device according to the present invention which has been wire-bonded. This semiconductor lead frame consists of a chip pad section, lead sections 921 and 925, and rotating portions 911 and 912. The chip pad section is shaped like a square cup with an open top and has a bottom surface 901, a left side 904, a right side 907, a front side (not shown), and a rear side (not shown). A semiconductor chip 3 is stuck to a specified position of an inner bottom surface 903 of the bottom surface 901. A bottom surface 301 of the semiconductor chip 3 contacts the inner bottom surface 903 of the chip pad section, while a left and a right sides 302 and 303 of the semiconductor chip 3 stand apart from the left and right sides 904 and 907 of the chip pad section, respectively. On the other hand, the inner leads 923 of the lead section 921 and the inner leads 926 of the lead section 925 are located slightly above the upper open-side periphery of the chip pad section and thus extend apart from a top surface 304 of the semiconductor chip 3. Thus, the rotating portions 911 and 912 are press-bent. This processing is generally called down setting. Furthermore, Au wires 401 and 402 are used to connect together a large number of electrodes located on the periphery of the semiconductor chip 3 and the ends of the corresponding inner leads. Also shown in FIG. 11, the chip pad section is shaped like a square cup that has bottom surface 901, left side 904, a right side, front side 990, rear side 991 and an open top. The semiconductor chip (not shown in FIGS. 10 and 11) is mounted or attached on the bottom surface 901 of the chip paid section. A depth of the square cup is equivalent to a thickness of the semiconductor chip, so that a level or a vertical position of the upper surface of the semiconductor chip is mounted or located slightly under the inner leads 921, 925.

Subsequently, resin molding is executed to cover and seal with a resin 5 the inner leads 923 and 926, and the external surfaces 905 and 909 of the left and right sides 904 and 907 of the chip pad section. On the other hand, the external surface 902 of the bottom surface 901 of the chip pad section is exposed to allow heat to be efficiently radiated to the air. In addition, the outer leads 924 of the lead section 921 and the outer leads 927 of the lead section 925 protrude out from the resin.

After the lead frame has been sealed with the resin, the rotating portions 911 and 912 are partly cut off and removed to disable the electrical conduction between the lead sections 921 and 925 and the chip pad section. Furthermore, the outer leads 924 and 927 are each bent downward in the perpendicular direction as required. In this manner, the semiconductor device according to the present invention is manufactured.

The semiconductor device manufacturing method according to the present invention uses the long flat sheet material and requires no combining steps to reduce material costs and to enable continuous manufacturing without errors while maintaining high dimensional accuracy.

In addition, in the semiconductor device manufacturing method according to the present invention, the chip pad section is shaped like a square cup with an open top wherein the semiconductor chip is stuck to the inner bottom surface and wherein the sides are resin-molded, whereas the outer bottom surface is exposed from the resin. This configuration enables heat to be appropriately radiated from the outer bottom surface of the chip pad section without increasing the thickness of the chip pad section, and effectively prevents moisture from entering the inside of the semiconductor device, particularly, the periphery of the semiconductor chip.

While the foregoing description and drawings represent the preferred embodiments of the present invention, it will be obvious to those skilled in the art that various changes and modifications may be made therein without departing from the true spirit and scope of the present invention.

What is claimed is:

1. A semiconductor lead frame made of alloy plate, comprising:

a chip pad section on which a semiconductor chip is mounted; and lead sections including inner leads that are wire-bonded to electrodes of the semiconductor chip and outer leads that protrude out from the lead frame after packaging, the chip pad section and the lead sections being connected together with folding portions which are folded with a Z letter shape and adhered together, the ends of the inner leads of the lead sections overlapping the chip pad section and being located around a semiconductor chip mounting position of the chip pad section, the semiconductor lead frame being manufactured by the steps of:

press-punching a lead-frame alloy plate to form the chip pad section and lead sections, the chip pad section and the lead sections being connected together using folding portions, which have not been folded, and the chip pad section sitting apart from the lead sections without overlapping; and folding the folding portions by means of press bending to allow the ends of inner leads of the lead sections to overlap the chip pad section in order to locate the ends around a semiconductor chip mounting position of the chip pad section.

2. The semiconductor lead frame according to claim 1, wherein the chip pad section is shaped like a square cup having a depth equivalent to a thickness of the semiconductor chip and with an open top, and the ends of inner leads of the lead sections are located slightly above the periphery of the chip pad section.

3. The semiconductor lead frame according to claim 2, wherein the chip pad section is shaped like a square cup having a depth equivalent to a thickness of the semiconductor chip and with an open top, and the ends of inner leads of the lead sections are located slightly above the periphery of the chip pad section.

4. A semiconductor lead frame made of alloy plate, comprising:

a chip pad section on which a semiconductor chip is mounted; and lead sections including inner leads that are wire-bonded to electrodes of the semiconductor chip and outer leads that protrude out from the lead frame after packaging, the chip pad section and the lead sections being connected with rotating portions which are rotated through 180°, the ends of the inner leads of the lead sections overlapping the chip pad section and being located around a semiconductor chip mounting position of the chip pad section, the semiconductor lead frame being manufactured by the steps of:

press-punching a lead-frame alloy plate to form a chip pad section and lead sections, the chip pad section and the lead sections being connected together using rotating portions around which the lead sections have not been rotated and the chip pad section sitting apart from the lead sections without overlapping; and repeating press bending to rotate the lead sections around the rotating portions in order to allow the ends of inner leads of the lead sections to overlap the chip pad section, thereby locating the ends around a semiconductor chip mounting position of the chip pad section.

* * * * *